(12) United States Patent
Heber et al.

(10) Patent No.: US 8,060,321 B2
(45) Date of Patent: Nov. 15, 2011

(54) SYSTEM AND METHOD FOR DETECTING AN ELECTRICAL SHORT ACROSS A STATIC SWITCH OF AN UNINTERRUPTIBLE POWER SUPPLY

(75) Inventors: Brian P. Heber, Delaware, OH (US); Jason D. Peltier, Dublin, OH (US)

(73) Assignee: Liebert Corporation, Columbus, OH (US)

( * ) Notice: Subject to any disclaimer, the term of this patent is extended or adjusted under 35 U.S.C. 154(b) by 315 days.

(21) Appl. No.: 12/389,713

(22) Filed: Feb. 20, 2009

(65) Prior Publication Data
US 2010/0042344 A1 Feb. 18, 2010

Related U.S. Application Data

(60) Provisional application No. 61/089,280, filed on Aug. 15, 2008.

(51) Int. Cl.
*H01H 35/00* (2006.01)
*G06F 17/40* (2006.01)
(52) U.S. Cl. .......... 702/58; 702/59; 702/64; 307/116
(58) Field of Classification Search .......... 702/58, 702/59, 64
See application file for complete search history.

(56) References Cited

U.S. PATENT DOCUMENTS

| | | | | | |
|---|---|---|---|---|---|
| 5,153,802 | A | * | 10/1992 | Mertz et al. | 361/18 |
| 5,170,310 | A | * | 12/1992 | Studtmann et al. | 361/94 |
| 5,315,533 | A | * | 5/1994 | Stich et al. | 700/298 |

* cited by examiner

*Primary Examiner* — Hal Wachsman
(74) *Attorney, Agent, or Firm* — Harness, Dickey & Pierce, P.L.C.

(57) ABSTRACT

A monitoring system for detecting a short circuit condition in a switching subsystem of a bypass input of a power supply. The system may comprise a voltage monitoring subsystem for monitoring a voltage across at least one component of the switching subsystem and generating a first output signal in accordance therewith. A processor, responsive to the first output signal from the voltage monitoring subsystem, may be used to compare the first output signal with a predetermined threshold signal and to generate a second output signal based on the comparison. The processor may also be used to consider a state of a circuit breaker in communication with the switching subsystem and to use the state of the circuit breaker and the second output signal to determine whether at least one of a short circuit condition and an open circuit condition exists with respect to the switching subsystem.

20 Claims, 2 Drawing Sheets

SYSTEM AND METHOD FOR DETECTING AN ELECTRICAL SHORT ACROSS A STATIC SWITCH OF AN UNINTERRUPTIBLE POWER SUPPLY

CROSS-REFERENCE TO RELATED APPLICATION

This application claims the benefit of U.S. Provisional Application No. 61/089,280, filed on Feb. 20, 2009. The entire disclosure of the above application is incorporated herein by reference.

FIELD

The present disclosure relates to voltage monitoring systems used with power supplies, and more particularly to a voltage monitoring system and method that may be used with an uninterruptible power supply for detecting both short circuit and open circuit conditions that may arise for one or more switching circuits used in a bypass input of the uninterruptible power supply.

BACKGROUND

Both Underwriters Laboratories ("UL") and the International Electrotechnical Commission ("IEC") have requirements that state that hazardous voltage shall not appear on the input terminals of an uninterruptible power supply ("UPS") when the UPS is operating in a stored energy mode. The hazardous voltage is presently designated as being any voltage above 30V RMS. Additional requirements are that the hazardous voltage condition shall be cleared within fifteen seconds given a single component failure within the detection/prevention circuit being used (UL 1778 and IEC 62040-1-1).

Ideally, any monitoring/detecting system used to detect open and short circuit conditions in a bypass input of a UPS should be cost effective to implement and not require major modifications to the construction of the UPS itself.

SUMMARY

In one aspect the present disclosure relates to a monitoring system for detecting a short circuit condition in a switching subsystem of a bypass input of a power supply. The system may comprise a voltage monitoring subsystem for monitoring a voltage across at least one component of the switching subsystem and generating a first output signal in accordance therewith. A processor, responsive to the first output signal from the voltage monitoring subsystem, may be used to compare the first output signal with a predetermined threshold signal and to generate a second output signal based on the comparison. The processor may also be used to consider a state of a circuit breaker in communication with the switching subsystem and to use the state of the circuit breaker and the second output signal to determine whether at least one of a short circuit condition and an open circuit condition exists with respect to the switching subsystem.

In another aspect the present disclosure relates to a monitoring system for monitoring operation of a static switching circuit of a bypass input of an uninterruptible power supply (UPS). The system may comprise: a voltage monitoring subsystem for monitoring a voltage across at least one component of the static switching circuit and generating a first output signal. The circuit breaker may be coupled in series with the static switching circuit. A processor, responsive to the first output signal and to a condition of the circuit breaker, may be used to compare the first output signal with a threshold signal and to generate a second output signal based on the comparison. The processor may be adapted to use the second output signal and the condition of the circuit breaker to determine if at least one of a short circuit condition and an open circuit condition exists in the static switching circuit.

In still another aspect the present disclosure relates to a method for monitoring a switching subsystem of a bypass input of an uninterruptible power supply (UPS). The method may comprise monitoring a voltage across at least one component of the switching subsystem and generating a first output signal indicative of a voltage across the one component. A comparison may be made between the first output signal and a threshold signal, and a second output signal generated in response to the comparison. A state of a circuit breaker in communication with the switching subsystem may be detected, and the second output signal and the state of the circuit breaker may be used to determine if at least one of a short circuit condition and an open exists in the switching subsystem.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
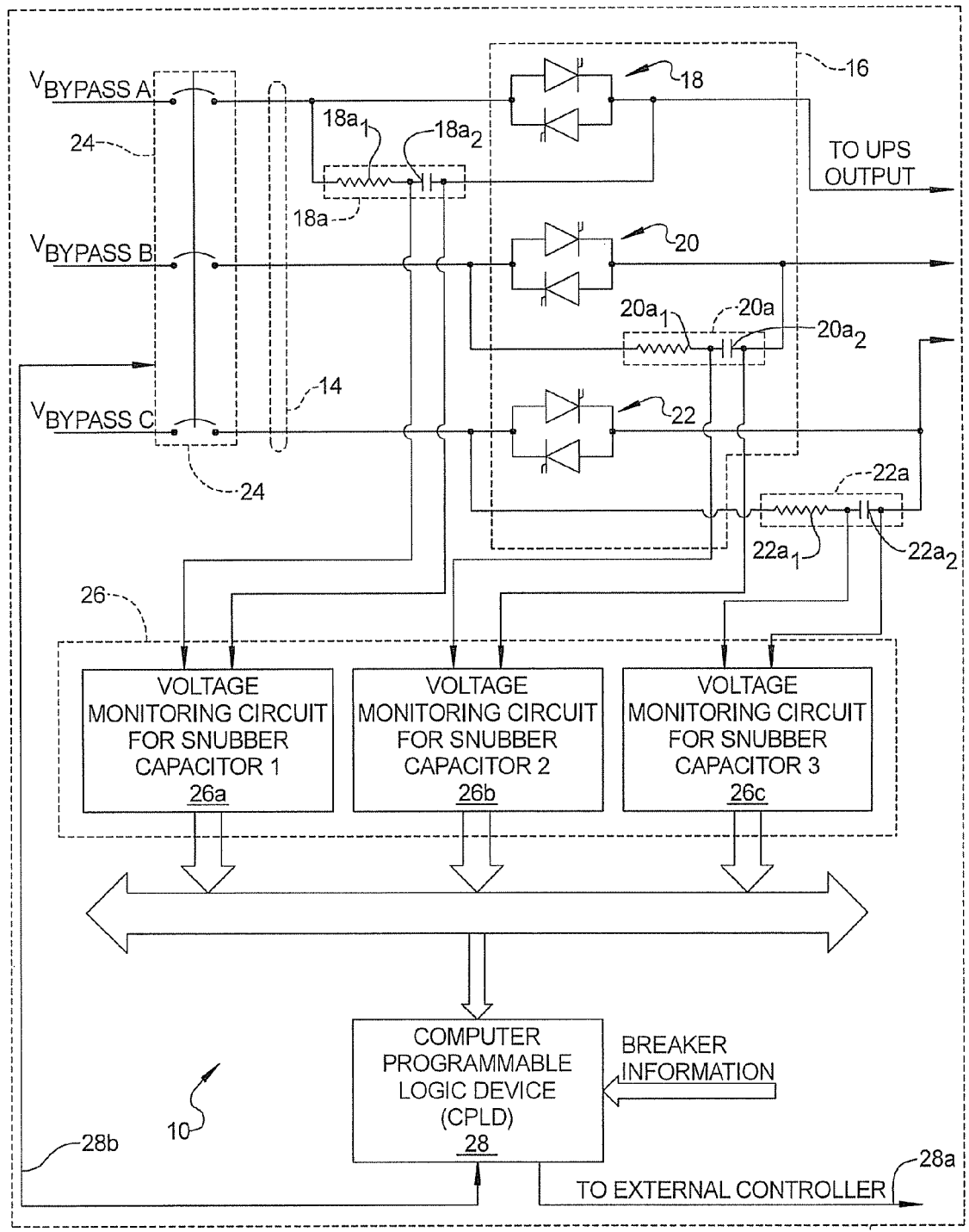
FIG. 1 is a block diagram of one embodiment of a monitoring system of the present disclosure, with the monitoring system being located within an uninterruptible power supply (UPS)

The following description is merely exemplary in nature and is not intended to limit the present disclosure, application, or uses. It should be understood that throughout the drawings, corresponding reference numerals indicate like or corresponding parts and features.

Referring to FIG. 1, there is shown a monitoring system 10 that is implemented within an uninterruptible power supply ("UPS") 12. The monitoring system 10 is able to monitor and detect when an open circuit condition or a short circuit condition arises between any phase of the bypass input power lines 14 and the same phase on the output of the UPS 12.

The monitoring system 10 is in communication with a static switching system 16 of the UPS 12. The static switching system 16 in this example includes three distinct static switching circuits 18, 20 and 22 that each include a pair of back to back silicon controlled rectifiers (SCRs) that each function as a static switch. Static switching circuit 18 includes a snubber circuit 18a comprised of a resistor $18a_1$ and a snubber capacitor $18a_2$. Similarly, static switching circuit 20 has its own snubber circuit 20a having resistor $20a_1$ and snubber capacitor $20a_2$. Likewise, static switching circuit 22 has its own snubber circuit 22a having resistor $22a_1$ and snubber capacitor $22a_2$. A back feed breaker 24 is also typically placed in the power lines that run to the bypass input terminals 14. However, circuit breakers may be disposed at various other locations within the bypass input power lines 14 running to the static switching circuits 18, 20 and 22.

The monitoring system 10 may include a voltage monitoring subsystem 26 made up of three independent voltage monitoring circuits 26a, 26b and 26c. Voltage monitoring circuit 26a is in communication with the snubber circuit 18a of static switching circuit 18, while voltage monitoring circuit 26b is in communication with the snubber circuit 20a of static switching circuit 20, and voltage monitoring circuit 26c is in communication with the snubber circuit 22a of static switching circuit 22. This enables the differential voltage across the snubber capacitor $18a_2$, $20a_2$ and $22a_2$ of each snubber circuit 18a, 20a and 22a, respectively, to be detected. As will be explained in the following paragraphs, this voltage detection enables both a short circuit condition and an open circuit condition for any of the static switching circuits 18, 20 and 22 to be detected by a computer programmable logic device (CPLD) 28. The CPLD receives voltage sense signals from each of the voltage monitoring circuits 26a, 26b and 26c. It will also be appreciated, however, that the precise sense point where the voltage monitoring circuits 26a, 26b and 26c are connected, relative to the switching circuits 18, 20 and 22, will depend on the precise location of the circuit breakers that are used in connection with the bypass input lines. Thus, it will be understood that the precise sensing points shown in FIG. 1 within each static switching circuit 18, 20 and 22 are purely exemplary and may be varied to accommodate the placement of various circuit breakers.

With further reference to FIG. 1, each of the voltage monitoring circuits 26a, 26b and 26c may include conventional rectification circuits to provide a direct current voltage (vdc) signal, which may be termed a "first output signal", that can be analyzed by the CPLD 28 against a predetermined voltage reference threshold. In one example this voltage reference threshold may be 2.5 vdc, although it will be appreciated that this value may vary significantly to meet the needs of a specific application. The CPLD 28 makes a comparison of the sensed voltage across the snubber capacitor $18a_2$, $20a_2$, $22a_2$ of each snubber circuit 18a, 20a and 22a and generates what may be termed a "second output signal" in response to each comparison. The second output signals may be used to assist in determining if an open circuit or a short circuit condition is present in each of the static switching circuits 18, 20 and 22 while the static switching circuits are inactive. The CPLD 28 may also analyze information concerning the location and state of each breaker that is used with the system 10 in making the short circuit and open circuit determinations. In this example only the back feed breaker 24 is being used, and such information, together with the state of the back feed breaker 24, is provided to the CPLD 28. The CPLD 28 uses the second output signals and the state of the back feed breaker 24 to determine whether an open circuit condition or a short circuit condition exists with any of the static switching circuits 18, 20 and 22. If a short circuit condition is detected by the CPLD 28, the CPLD may send a signal on line 28b to place the back feed breaker 24 in an open condition. If an open circuit condition is detected in any of the static switching circuits 18, 20 or 22, the CPLD 28 may send a signal on line 28a to an external controller to notify the external controller of the open circuit condition.

Figure 2:
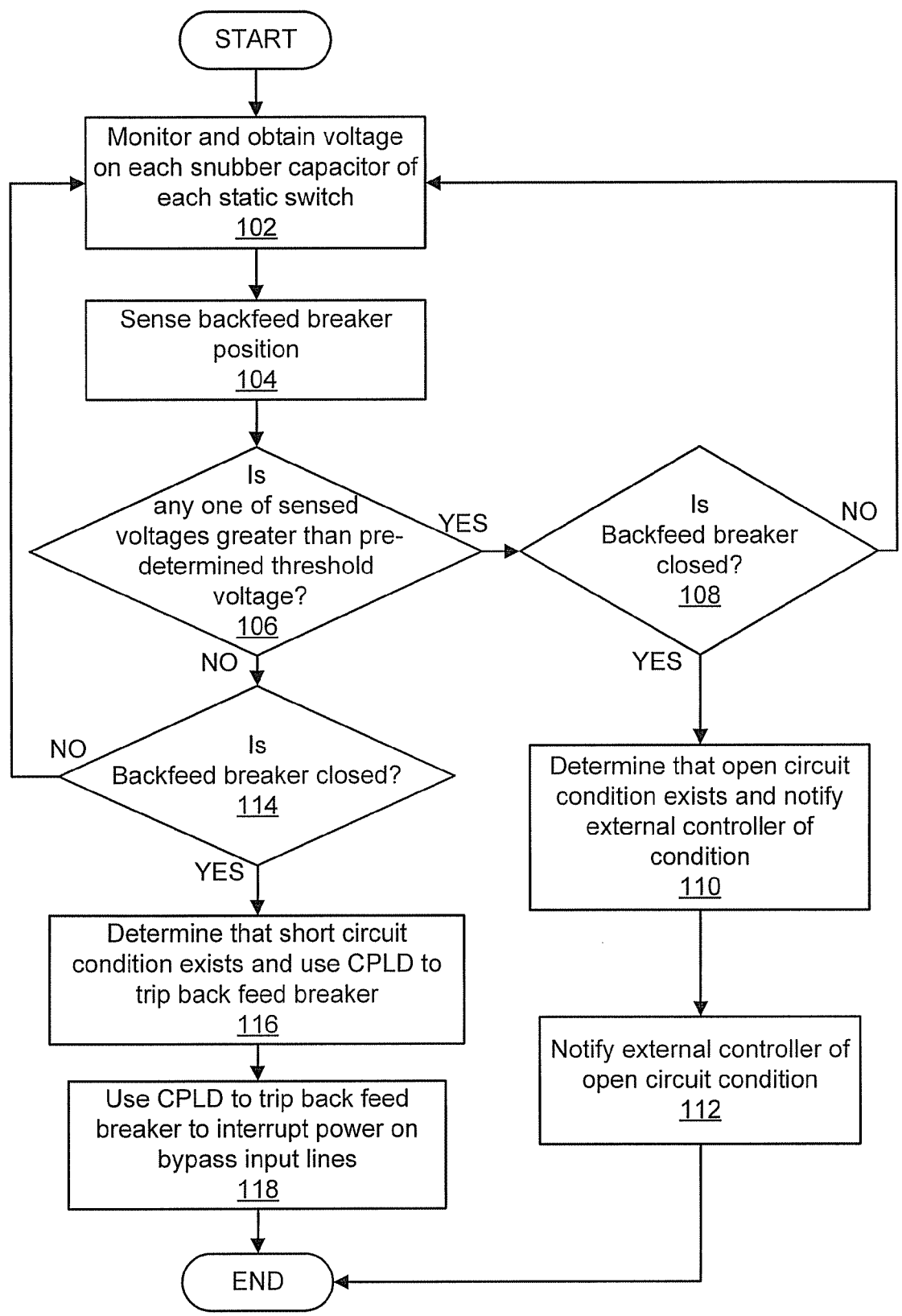
FIG. 2 is a flowchart of major operations that are performed in monitoring the status of the static switching system for each of an open circuit condition or a short circuit condition.

The operation of the monitoring system 10 will now be explained with reference to the flowchart 100 of FIG. 2. Initially at operation 102, the voltage across the snubber capacitor $18a_2$, $20a_2$, $22a_2$ of each snubber circuit 18a, 20a and 22a is sensed by each of the voltage monitoring circuits 26a, 26b and 26c. The sensed voltages form the first output signals that are all provided to the CPLD 28. At operation 104 the position of the back feed breaker 24 is sensed by the CPLD 28. At operation 106 the CPLD 28 compares the sensed voltage for each of the snubber circuits 18a, 20a and 22a with the predetermined threshold voltage, in this example +2.5 vdc, and generates the second output signal in response to each comparison performed. If any of the second output signals indicate that one or more of the sensed voltages across the snubber capacitors $18a_2$, $20a_2$, $22a_2$ of snubber circuits 18a, 20a or 22a is greater than the 2.5 vdc threshold value, then a check is made by the CPLD 28 to sense if the back feed breaker 24 is closed, as indicated at operation 108. If the back feed breaker 24 is detected as being closed, then the CPLD 28 determines that an open circuit condition exists, as indicated at operation 110. At operation 112 the CPLD 28 may then notify an external (not shown) UPS controller of this condition. If the check at operation 108 indicates that the back feed breaker 24 is open, then monitoring by the voltage monitoring circuits 26a, 26b and, 26c continues at operation 102.

If the check at operation 106 by the CPLD 28 produces a "No" answer, meaning that the sensed voltages from all of the voltage detection circuits 26a, 26b or 26c are each less than or equal to the 2.5 vdc threshold voltage, then the CPLD 28 generates the second output signals and makes a check at operation 114 to determine if the back feed breaker 24 is closed. If the check of the back feed breaker 24 at operation 114 reveals that it is closed, then the CPLD 28 concludes that a short circuit condition exists with one or more of the static switching circuits 18, 20 and 22, as indicated at operation 116. At operation 118 the CPLD 28 will then trip (i.e., open) the back feed breaker 24 via a signal on line 28b to interrupt power on the bypass input lines 14 to the static switching circuits 18, 20 and 22. The monitoring of the voltages across each of the static switching circuits 18a, 20a and 22a, as well as the evaluation performed by the CPLD 28 and the circuit breaker tripping signal generated by the CPLD 28, all occur in real time. If the check at operation 114 shows that the back feed breaker is open, then monitoring by the voltage monitoring circuits 26a, 26b, and 26c continues at operation 102.

A particular advantage of the system 10 is that both short circuit and open circuit conditions can be detected by the CPLD 28 in real time. Thus, the analysis of the CPLD 28 takes into account the sensed voltages across all of the snubber capacitors $18a_2$, $20a_2$ and $22a_2$ as well as the location and state of the breaker(s) being used with the system 10. The system 10 detects a short circuit condition whether it is one of the snubber capacitors $18a_2$, $20a_2$, $22a_2$ or one of the SCRs of each static switching circuit 18, 20 or 22 that becomes shorted. Thus, the system 10 can detect the presence of a hazardous voltage in real time on the bypass input power lines 14.

The monitoring system 10 thus forms a cost effective and easily implemented system within a UPC. While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A monitoring system for detecting a short circuit condition in a switching subsystem being used in a bypass input of a power supply, in which the bypass input also includes a circuit breaker in communication with the switching subsystem, the monitoring system comprising:

a voltage monitoring subsystem for monitoring a voltage across at least one component of the switching subsystem and generating a first output signal in accordance therewith; and a processor responsive to the first output signal from the voltage monitoring subsystem that compares a voltage value of the first output signal with a predetermined threshold signal and generates a second output signal based on the comparison, the processor further adapted to consider a state of the circuit breaker in communication with the switching subsystem, and to use the state of the circuit breaker and the second output signal to determine whether at least one of a short circuit condition and an open circuit condition exists with respect to the switching subsystem.

2. The monitoring system of claim 1, wherein the processor is adapted to indicate that either the open circuit condition or the short circuit condition is present.

3. The monitoring system of claim 2, wherein:
the circuit breaker is in communication with the processor and disposed in series with the switching subsystem;
the processor is adapted to read a state of the circuit breaker to determine if the circuit breaker is open or closed; and
the processor is adapted to send a signal to an external controller when the open circuit condition is detected.

4. The monitoring system of claim 3, wherein the processor uses the state of the circuit breaker and the comparison of the first output signal and the threshold signal to determine if either the open circuit condition or the closed circuit condition is present with respect to the switching subsystem.

5. The monitoring system of claim 4, wherein the processor controls the circuit breaker to interrupt current flow through said switching subsystem when the short circuit condition is detected in the switching subsystem and the circuit breaker is detected as being in a closed condition.

6. The monitoring system of claim 1, wherein the component that the voltage monitoring circuit is monitoring a voltage across comprises a snubber capacitor.

7. The monitoring system of claim 1, wherein the switching subsystem comprises three independent switching circuits, one for each of three different phases of a three phase input signal; and
the voltage monitoring subsystem comprises three independent voltage monitoring circuits, one said independent voltage monitoring circuit being associated with a respective one of each of the independent switching circuits.

8. A monitoring system for monitoring operation of a static switching circuit being used in a bypass input of an uninterruptible power supply (UPS), the monitoring system comprising:
a voltage monitoring subsystem for monitoring a voltage across at least one component of the static switching circuit and generating a first output signal;
a circuit breaker coupled in series with the static switching circuit;
a processor responsive to the first output signal and to a condition of the circuit breaker, the processor adapted to compare a voltage value of the first output signal with a threshold signal and to generate a second output signal based on the comparison, the processor adapted to use the second output signal and the condition of the circuit breaker to determine if at least one of a short circuit condition and an open circuit condition exists in the static switching circuit.

9. The monitoring system of claim 8, wherein the processor is adapted to determine if either the short circuit condition or the open circuit condition exists in the static switching circuit.

10. The monitoring system of claim 9, wherein the processor determines that the short circuit condition exists in the static switching circuit based on the second output signal indicating that the first output signal is equal to or less than the threshold signal, and the circuit breaker is in a closed condition.

11. The monitoring system of claim 8, wherein the processor is further adapted to control the circuit breaker when the short circuit condition exists in the static switching circuit to interrupt current flow through the static switching circuit.

12. The monitoring system of claim 8, wherein:
the static switching circuit comprises a plurality independent switching circuits, one for each phase of a three phase input signal being supplied to the independent static switching circuits;
wherein each one of the independent static switching circuits has a snubber capacitor; and
wherein the voltage monitoring subsystem comprises a plurality of independent voltage monitoring circuits each associated with a respective one of the independent static switching circuits.

13. The monitoring system of claim 12, wherein each of the independent voltage monitoring circuits is adapted to monitor a voltage across the snubber capacitor of an associated one of the independent static switching circuits.

14. The monitoring system of claim 13, wherein the processor comprises a programmable logic device.

15. A method for monitoring a switching subsystem of a bypass input being used in an uninterruptible power supply (UPS), wherein the bypass input has a circuit breaker in communication with the switching subsystem, the method comprising:
monitoring a voltage across at least one component of the switching subsystem and generating a first output signal indicative of a voltage across the one component;
comparing a voltage value of the first output signal with a threshold signal and generating a second output signal based on the comparison;
detecting a state of the circuit breaker; and
using the second output signal and the state of the circuit breaker to determine if at least one of a short circuit condition and an open circuit condition exists in the switching subsystem.

16. The method of claim 15, further comprising determining if either the short circuit condition or the open circuit condition exists.

17. The method of claim 16, further comprising informing an external controller if the open circuit condition exists.

18. The method of claim 16, further comprising determining that the short circuit condition exists when the voltage value of the first output signal is less than or equal to the threshold signal, and the circuit breaker is in a closed condition.

19. The method of claim 15, further comprising placing the circuit breaker in an open state when it is determined that a short circuit condition exists in the switching subsystem.

20. The method of claim 15, wherein said comparing the first output signal with a threshold signal comprises comparing a detected voltage across a snubber capacitor of the switching subsystem with the threshold signal.

* * * * *